(12) United States Patent
Miller, Jr. et al.

(10) Patent No.: US 7,960,827 B1
(45) Date of Patent: Jun. 14, 2011

(54) THERMAL VIA HEAT SPREADER PACKAGE AND METHOD

(75) Inventors: August J. Miller, Jr., Queen Creek, AZ (US); Jeffrey A. Miks, Chandler, AZ (US); Christopher M. Scanlan, Hellerup (DK); Mahmoud Dreiza, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 66 days.

(21) Appl. No.: 12/421,118

(22) Filed: Apr. 9, 2009

(51) Int. Cl.
*H01L 23/34* (2006.01)

(52) U.S. Cl. .................. 257/712; 257/717; 257/E23.08

(58) Field of Classification Search .................. 257/712, 257/717, E23.08, E23.07, E21.499, 692
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |

(Continued)

FOREIGN PATENT DOCUMENTS

JP 05-109975 4/1993

(Continued)

OTHER PUBLICATIONS

IBM Technical Disclosure Bulletin, "Microstructure Solder Mask by Means of a Laser", vol. 36, Issue 11, p. 589, Nov. 1, 1993.

(Continued)

*Primary Examiner* — Roy K Potter
(74) *Attorney, Agent, or Firm* — Gunnison, McKay & Hodgson, L.L.P.; Serge J. Hodgson

(57) ABSTRACT

A thermal via heat spreader package includes an electronic component having an active surface including a nonfunctional region. A package body encloses the electronic component, the package body comprising a principal surface. Thermal vias extend from the principal surface through at least a portion of the package body and towards the nonfunctional region. A heat spreader is thermally connected to the thermal vias. Heat generated by the electronic component is dissipated to the thermal vias and to the heat spreader. The density of the thermal vias is increased in a hotspot of the electronic component thus maximizing heat transfer from the hotspot. In this manner, optimal heat transfer from the electronic component is achieved.

14 Claims, 9 Drawing Sheets

U.S. PATENT DOCUMENTS

| | | | |
|---|---|---|---|
| 5,239,448 | A | 8/1993 | Perkins et al. |
| 5,247,429 | A | 9/1993 | Iwase et al. |
| 5,250,843 | A | 10/1993 | Eichelberger |
| 5,278,726 | A | 1/1994 | Bernardoni et al. |
| 5,283,459 | A | 2/1994 | Hirano et al. |
| 5,353,498 | A | 10/1994 | Fillion et al. |
| 5,371,654 | A | 12/1994 | Beaman et al. |
| 5,379,191 | A | 1/1995 | Carey et al. |
| 5,404,044 | A | 4/1995 | Booth et al. |
| 5,463,253 | A | 10/1995 | Waki et al. |
| 5,474,957 | A | 12/1995 | Urushima |
| 5,474,958 | A | 12/1995 | Djennas et al. |
| 5,497,033 | A | 3/1996 | Fillion et al. |
| 5,508,938 | A | 4/1996 | Wheeler |
| 5,530,288 | A | 6/1996 | Stone |
| 5,531,020 | A | 7/1996 | Durand et al. |
| 5,546,654 | A | 8/1996 | Wojnarowski et al. |
| 5,574,309 | A | 11/1996 | Papapietro et al. |
| 5,581,498 | A | 12/1996 | Ludwig et al. |
| 5,582,858 | A | 12/1996 | Adamopoulos et al. |
| 5,616,422 | A | 4/1997 | Ballard et al. |
| 5,637,832 | A | 6/1997 | Danner |
| 5,674,785 | A | 10/1997 | Akram et al. |
| 5,719,749 | A | 2/1998 | Stopperan |
| 5,726,493 | A | 3/1998 | Yamashita et al. |
| 5,739,581 | A | 4/1998 | Chillara et al. |
| 5,739,585 | A | 4/1998 | Akram et al. |
| 5,739,588 | A | 4/1998 | Ishida et al. |
| 5,742,479 | A | 4/1998 | Asakura |
| 5,774,340 | A | 6/1998 | Chang et al. |
| 5,784,259 | A | 7/1998 | Asakura |
| 5,798,014 | A | 8/1998 | Weber |
| 5,822,190 | A | 10/1998 | Iwasaki |
| 5,826,330 | A | 10/1998 | Isoda et al. |
| 5,835,355 | A | 11/1998 | Dordi |
| 5,847,453 | A | 12/1998 | Uematsu et al. |
| 5,883,425 | A | 3/1999 | Kobayashi |
| 5,894,108 | A | 4/1999 | Mostafazadeh et al. |
| 5,903,052 | A | 5/1999 | Chen et al. |
| 5,907,477 | A | 5/1999 | Tuttle et al. |
| 5,936,843 | A | 8/1999 | Ohshima et al. |
| 5,952,611 | A | 9/1999 | Eng et al. |
| 6,004,619 | A | 12/1999 | Dippon et al. |
| 6,013,948 | A | 1/2000 | Akram et al. |
| 6,021,564 | A | 2/2000 | Hanson |
| 6,028,364 | A | 2/2000 | Ogino et al. |
| 6,034,427 | A | 3/2000 | Lan et al. |
| 6,035,527 | A | 3/2000 | Tamm |
| 6,040,622 | A | 3/2000 | Wallace |
| 6,060,778 | A | 5/2000 | Jeong et al. |
| 6,069,407 | A | 5/2000 | Hamzehdoost |
| 6,072,243 | A | 6/2000 | Nakanishi |
| 6,081,036 | A | 6/2000 | Hirano et al. |
| 6,119,338 | A | 9/2000 | Wang et al. |
| 6,122,171 | A | 9/2000 | Akram et al. |
| 6,127,833 | A | 10/2000 | Wu et al. |
| 6,160,705 | A | 12/2000 | Stearns et al. |
| 6,172,419 | B1 | 1/2001 | Kinsman |
| 6,175,087 | B1 | 1/2001 | Keesler et al. |
| 6,184,463 | B1 | 2/2001 | Panchou et al. |
| 6,194,250 | B1 | 2/2001 | Melton et al. |
| 6,204,453 | B1 | 3/2001 | Fallon et al. |
| 6,214,641 | B1 | 4/2001 | Akram |
| 6,235,554 | B1 | 5/2001 | Akram et al. |
| 6,239,485 | B1 | 5/2001 | Peters et al. |
| D445,096 | S | 7/2001 | Wallace |
| D446,525 | S | 8/2001 | Okamoto et al. |
| 6,274,821 | B1 | 8/2001 | Echigo et al. |
| 6,280,641 | B1 | 8/2001 | Gaku et al. |
| 6,316,285 | B1 | 11/2001 | Jiang et al. |
| 6,351,031 | B1 | 2/2002 | Iijima et al. |
| 6,353,999 | B1 | 3/2002 | Cheng |
| 6,365,975 | B1 | 4/2002 | DiStefano et al. |
| 6,376,906 | B1 | 4/2002 | Asai et al. |
| 6,392,160 | B1 | 5/2002 | Andry et al. |
| 6,395,578 | B1 | 5/2002 | Shin et al. |
| 6,405,431 | B1 | 6/2002 | Shin et al. |
| 6,406,942 | B2 | 6/2002 | Honda |
| 6,407,341 | B1 | 6/2002 | Anstrom et al. |
| 6,407,930 | B1 | 6/2002 | Hsu |
| 6,448,510 | B1 | 9/2002 | Neftin et al. |
| 6,451,509 | B2 | 9/2002 | Keesler et al. |
| 6,479,762 | B2 | 11/2002 | Kusaka |
| 6,497,943 | B1 | 12/2002 | Jimarez et al. |
| 6,517,995 | B1 | 2/2003 | Jacobson et al. |
| 6,534,391 | B1 | 3/2003 | Huemoeller et al. |
| 6,544,638 | B2 | 4/2003 | Fischer et al. |
| 6,586,682 | B2 | 7/2003 | Strandberg |
| 6,608,757 | B1 | 8/2003 | Bhatt et al. |
| 6,660,559 | B1 | 12/2003 | Huemoeller et al. |
| 6,715,204 | B1 | 4/2004 | Tsukada et al. |
| 6,727,645 | B2 | 4/2004 | Tsujimura et al. |
| 6,730,857 | B2 | 5/2004 | Konrad et al. |
| 6,734,542 | B2 | 5/2004 | Nakatani et al. |
| 6,740,964 | B2 | 5/2004 | Sasaki |
| 6,753,612 | B2 | 6/2004 | Adae-Amoakoh et al. |
| 6,774,748 | B1 | 8/2004 | Ito et al. |
| 6,787,443 | B1 | 9/2004 | Boggs et al. |
| 6,803,528 | B1 | 10/2004 | Koyanagi |
| 6,815,709 | B2 | 11/2004 | Clothier et al. |
| 6,815,739 | B2 | 11/2004 | Huff et al. |
| 6,838,776 | B2 | 1/2005 | Leal et al. |
| 6,888,240 | B2 | 5/2005 | Towle et al. |
| 6,919,514 | B2 | 7/2005 | Konrad et al. |
| 6,921,968 | B2 | 7/2005 | Chung |
| 6,921,975 | B2 | 7/2005 | Leal et al. |
| 6,931,726 | B2 | 8/2005 | Boyko et al. |
| 6,953,995 | B2 | 10/2005 | Farnworth et al. |
| 6,963,141 | B2 * | 11/2005 | Lee et al. ............ 257/796 |
| 7,015,075 | B2 | 3/2006 | Fay et al. |
| 7,030,469 | B2 | 4/2006 | Mahadevan et al. |
| 7,081,661 | B2 | 7/2006 | Takehara et al. |
| 7,087,514 | B2 | 8/2006 | Shizuno |
| 7,125,744 | B2 | 10/2006 | Takehara et al. |
| 7,185,426 | B1 | 3/2007 | Hiner et al. |
| 7,189,593 | B2 | 3/2007 | Lee |
| 7,198,980 | B2 | 4/2007 | Jiang et al. |
| 7,242,081 | B1 | 7/2007 | Lee |
| 7,282,394 | B2 | 10/2007 | Cho et al. |
| 7,285,855 | B2 | 10/2007 | Foong |
| 7,345,361 | B2 | 3/2008 | Mallik et al. |
| 7,372,151 | B1 | 5/2008 | Fan et al. |
| 7,420,809 | B2 * | 9/2008 | Lim et al. ............ 361/707 |
| 7,429,786 | B2 | 9/2008 | Karnezos et al. |
| 7,459,202 | B2 | 12/2008 | Magera et al. |
| 7,548,430 | B1 | 6/2009 | Huemoeller et al. |
| 2002/0017712 | A1 | 2/2002 | Bessho et al. |
| 2002/0061642 | A1 | 5/2002 | Haji et al. |
| 2002/0066952 | A1 | 6/2002 | Taniguchi et al. |
| 2002/0195697 | A1 | 12/2002 | Mess et al. |
| 2003/0025199 | A1 | 2/2003 | Wu et al. |
| 2003/0128096 | A1 | 7/2003 | Mazzochette |
| 2003/0134450 | A1 | 7/2003 | Lee |
| 2003/0141582 | A1 | 7/2003 | Yang et al. |
| 2003/0197284 | A1 | 10/2003 | Khiang et al. |
| 2004/0063246 | A1 | 4/2004 | Karnezos |
| 2004/0145044 | A1 | 7/2004 | Sugaya et al. |
| 2004/0159462 | A1 | 8/2004 | Chung |
| 2005/0046002 | A1 | 3/2005 | Lee et al. |
| 2005/0139985 | A1 | 6/2005 | Takahashi |
| 2005/0242425 | A1 | 11/2005 | Leal et al. |
| 2006/0008944 | A1 | 1/2006 | Shizuno |
| 2006/0270108 | A1 | 11/2006 | Farnworth et al. |
| 2007/0273049 | A1 | 11/2007 | Khan et al. |
| 2007/0281471 | A1 | 12/2007 | Hurwitz et al. |
| 2007/0290376 | A1 | 12/2007 | Zhao et al. |
| 2008/0230887 | A1 | 9/2008 | Sun et al. |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", *58th ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Scanlan et al., "Semiconductor Package Including a Top-Surface Metal Layer for Implementing Circuit Features", U.S. Appl. No. 11/293,999, filed Dec. 5, 2005.

Longo et al., "Stacked Redistribution Layer (RDL) Die Assembly Package", U.S. Appl. No. 11/560,496, filed Nov. 16, 2006.

Hiner et al., "Semiconductor Package Including Top-Surface Terminals for Mounting Another Semiconductor Package", U.S. Appl. No. 11/595,411, filed Nov. 9, 2006.

Huemoeller et al., "Build Up Motherboard Fabrication Method and Structure", U.S. Appl. No. 11/824,395, filed Jun. 29, 2007.

Berry et al., "Thin Stacked Interposer Package", U.S. Appl. No. 11/865,617, filed Oct. 1, 2007.

Longo et al., "Stacked Redistribution Layer (RDL) Die Assembly Package", U.S. Appl. No. 12/387,672, filed May 5, 2009.

Huemoeller et al., "Buildup Dielectric Layer Having Metallization Pattern Semiconductor Package Fabrication Method", U.S. Appl. No. 12/387,691, filed May 5, 2009.

Scanlan et al., "Semiconductor Package Including a Top-Surface Metal Layer for Implementing Circuit Features", U.S. Appl. No. 12/589,839, filed Oct. 28, 2009.

Hiner et al., "Semiconductor Package Including Top-Surface Terminals for Mounting Another Semiconductor Package", U.S. Appl. No. 12/655,724, filed Jan. 5, 2010.

Hiner et al., "Semiconductor Package Including Top-Surface Terminals for Mounting Another Semiconductor Package", U.S. Appl. No. 12/802,681, filed Jun. 10, 2010.

Scanlan et al., "Semiconductor Package Including a Top-Surface Metal Layer for Implementing Circuit Features", U.S. Appl. No. 12/802,715, filed Jun. 10, 2010.

\* cited by examiner

THERMAL VIA HEAT SPREADER PACKAGE AND METHOD

BACKGROUND OF THE INVENTION

1. Field of the Invention

The present application relates to the field of electronics, and more particularly, to methods of forming electronic component packages and related structures.

2. Description of the Related Art

To form an electronic component package, the electronic component is mounted to a substrate. To protect the electronic component as well as the electrical interconnections therewith, the electronic component is covered in an encapsulant.

During use, the electronic component generates heat. This heat is dissipated through the substrate as well as through the encapsulant enclosing the electronic component. Unfortunately, the encapsulant is a poor thermal conductor thus restricting the heat dissipation from the electronic component to the ambient environment.

SUMMARY OF THE INVENTION

In accordance with one embodiment, a thermal via heat spreader package includes an electronic component having an active surface including a nonfunctional region. A package body, e.g., encapsulant, encloses the electronic component, the package body having a principal surface. Thermal vias extend from the principal surface through at least a portion of the package body and towards the nonfunctional region. A heat spreader is thermally connected to the thermal vias.

Heat generated by the electronic component is dissipated to the thermal vias and to the heat spreader. In one embodiment, the electronic component has a hotspot. In accordance with this embodiment, the density of the thermal vias is increased in the hotspot thus maximizing heat transfer from the hotspot. More particularly, the hotspot is specifically targeted with the thermal vias. In this manner, optimal heat transfer from the electronic component is achieved.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
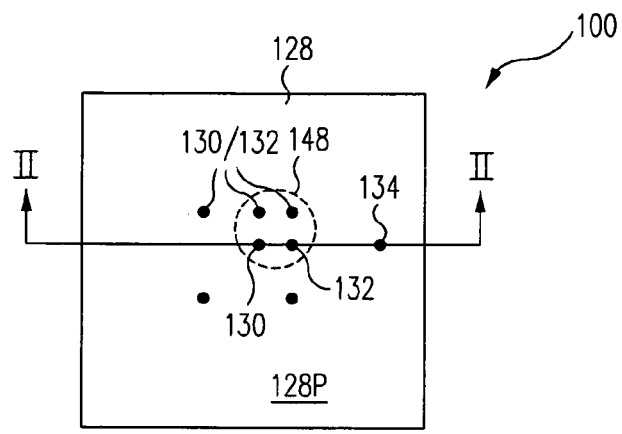
FIG. 1 is top plan view of a thermal via heat spreader package in accordance with one embodiment.
Figure 2:
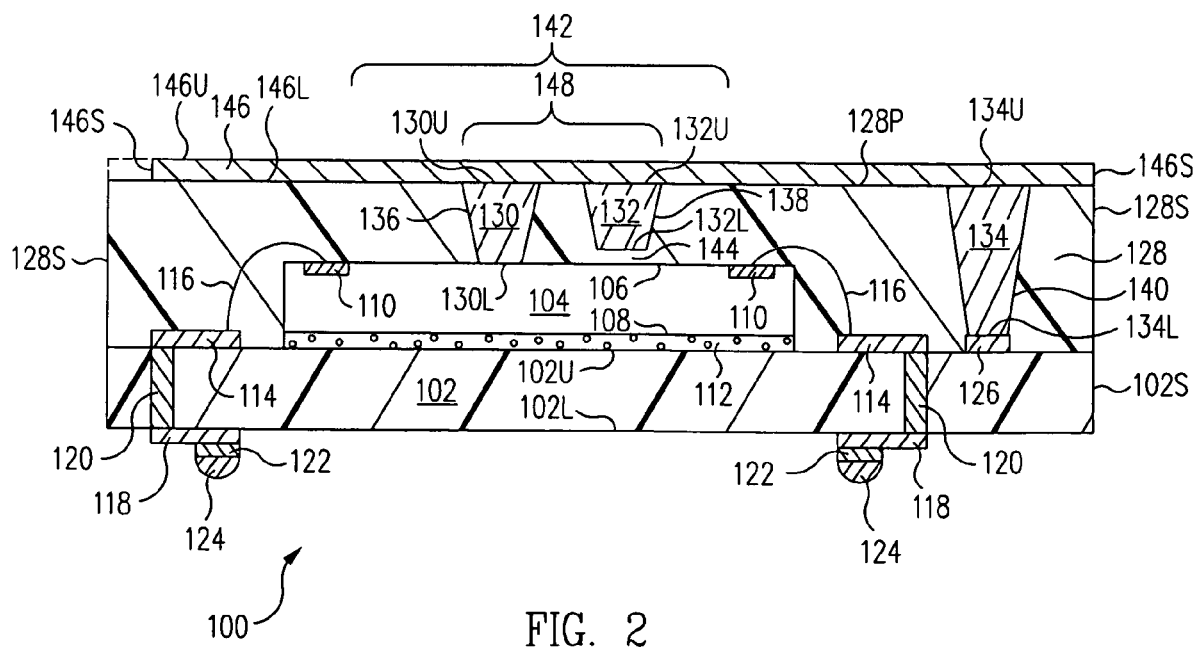
FIG. 2 is a cross-sectional view of the thermal via heat spreader package along the line II-II of FIG. 1 in accordance with one embodiment.

In accordance with one embodiment, referring to FIGS. 1 and 2 together, a thermal via heat spreader package 100 includes an electronic component 104 having an active surface 106 including a nonfunctional region 142. A package body 128, e.g., encapsulant, encloses electronic component 104, package body 128 comprising a principal surface 128P. Thermal vias 130, 132 extend from principal surface 128P through at least a portion of package body 128 and towards nonfunctional region 142. A heat spreader 146 is thermally connected to thermal vias 130, 132.

Heat generated by electronic component 104 is dissipated to thermal vias 130, 132 and to heat spreader 146. In one embodiment, electronic component 104 has a hotspot 148. In accordance with this embodiment, the density of thermal vias 130, 132 is increased in hotspot 148 thus maximizing heat transfer from hotspot 148. More particularly, hotspot 148 is specifically targeted with thermal vias 130, 132. In this manner, optimal heat transfer from electronic component 104 is achieved.

More particularly, FIG. 1 is top plan view of a thermal via heat spreader package 100 in accordance with one embodiment. FIG. 2 is a cross-sectional view of thermal via heat spreader package 100 along the line II-II of FIG. 1 in accordance with one embodiment.

Referring now to FIGS. 1 and 2 together, thermal via heat spreader package 100, sometimes called an electronic component package, includes a substrate 102 including an upper, e.g., first, surface 102U and an opposite lower, e.g., second, surface 102L. Substrate 102 further includes sides 102S extending perpendicularly between upper surface 102U to lower surface 102L. Substrate 102 is a dielectric material such as laminate, ceramic, printed circuit board material, or other dielectric material. In another embodiment, a leadframe forms a substrate for thermal via heat spreader package 100.

Thermal via heat spreader package 100 further includes an electronic component 104. In one embodiment, electronic component 104 is an integrated circuit chip, e.g., an active component. However, in other embodiments, electronic component 104 is a passive component such as a capacitor, resistor, or inductor.

In accordance with this embodiment, electronic component 104 includes an active surface 106 and an opposite inactive surface 108. Electronic component 104 further includes bond pads 110 formed on active surface 106. Inactive surface 108 is mounted to upper surface 102U of substrate 102 with an adhesive 112, sometimes called a die attach adhesive.

Formed on upper surface 102U of substrate 102 are electrically conductive upper, e.g., first, traces 114. Bond pads 110 are electrically connected to upper traces 114 by electrically conductive bond wires 116.

Formed on lower surface 102L of substrate 102 are lower, e.g., second, traces 118. Lower traces 118 are electrically connected to upper traces 114 by electrically conductive vias 120 extending through substrate 102 between upper surface 102U and lower surface 102L. Formed on lower traces 118 are pads 122, e.g., lands. Formed on pads 122 are interconnection balls 124, e.g., solder balls. Although not illustrated in FIGS. 1 and 2, in one embodiment, thermal via heat spreader package 100 further includes solder masks on upper and lower surface 102U, 102L that protect portions of upper and lower traces 114, 118.

Although a particular electrically conductive pathway between bond pads 110 and interconnection balls 124 is described above, other electrically conductive pathways can be formed. For example, contact metallizations can be formed between the various electrical conductors. Alternatively, pads 122 are not formed and interconnection balls 124 are formed directly on lower traces 118.

Further, instead of straight though vias 120, in one embodiment, substrate 102 is a multilayer substrate and a plurality of vias and/or internal traces form the electrical interconnection between upper traces 114 and lower traces 118.

In yet another embodiment, interconnection balls 124 are distributed in an array format to form a ball grid array (BGA) type package. Alternatively, interconnection balls 124 are not formed, e.g., to form a metal land grid array (LGA) type package. In yet another alternative, pads 122 and interconnection balls 124 are not formed, e.g., to form a leadless chip carrier (LCC) type package. BGA, LGA and LCC type packages are well known to those of skill in the art. Other electrically conductive pathway modifications will be obvious to those of skill in the art in light of this disclosure.

Also formed on the upper surface 102U of substrate 102 are electrically isolated heat spreader pads 126. Heat spreader pads 126 are electrically isolated from the other electrically conductive structures of thermal via heat spreader package 100 except thermal via 134 as discussed below. Illustratively, heat spreader pads 126 are electrically isolated from upper traces 114, vias 120, and bond wires 116.

In one embodiment, heat spreader pads 126 are formed at the same time and are similar to upper traces 114. However, heat spreader pads 126 function to remove heat from thermal via heat spreader package 100 whereas upper traces 114 function to provide electrical circuitry. In an alternative embodiment, one or more of heat spreader pads 126 function to provide electrical circuitry in a manner similar to upper traces 114.

Electronic component 104, bond wires 116, and the exposed portions of upper surface 102U including upper traces 114 and heat spreader pads 126 are enclosed, sometimes called encased, encapsulated, and/or covered, with a package body 128. Illustratively, package body 128 is a cured liquid encapsulant, molding compound, or other dielectric material. Package body 128 protects electronic component 104, bond wires 116, and the exposed portions of upper surface 102U including upper traces 114 and heat spreader pads 126 from the ambient environment, e.g., from contact, moisture and/or shorting to other structures.

Package body 128 includes a principal surface 128P parallel to upper surface 102U of substrate 102. In accordance with this embodiment, package body 128 includes sides 128S extending perpendicularly between substrate 102 and principal surface 128P. Sides 128S are parallel to and lie in the same plane as sides 102S of substrate 102. Illustratively, thermal via heat spreader package 100 is formed simultaneously with a plurality of packages in an array or strip. The array or strip is singulated resulting in sides 128S of package body 128 parallel to and lying in the same plane as sides 102S of substrate 102.

Although the terms parallel, perpendicular, and similar terms are used herein, it is to be understood that the described features may not be exactly parallel and perpendicular, but only substantially parallel and perpendicular to within excepted manufacturing tolerances.

Thermal via heat spreader package 100 includes thermal vias 130, 132, 134 penetrating into package body 128 from principal surface 128P. Thermal vias 130, 132, 134 are formed of a material, e.g., copper, having a thermal conductivity greater than the thermal conductivity of package body 128.

In one embodiment, thermal vias 130, 132, 134 are formed using a laser-ablation process. More particularly, a laser is repeatedly directed at principal surface 128P perpendicularly to principal surface 128P. This laser ablates, i.e., removes, portions of package body 128 leaving via apertures 136, 138, 140, sometimes called through holes.

In another embodiment, via apertures 136, 138, 140 are formed during the molding process used to form package body 128. For example, after formation of bond wires 116, the assembly is placed in a mold having pins or other protrusions corresponding to via apertures 136, 138, 140. Molding compound is introduced into the mold and around the pins or other protrusions corresponding to via apertures 136, 138, 140. After the molding compound solidifies, the assembly is removed from the mold. Via apertures 136, 138, 140 are created by the voids left behind from the removal of the pins or other protrusions. Via apertures 136, 138, 140 are sometimes called molded dimples in accordance with this embodiment.

In either embodiment, via apertures 136, 138, 140 are then filled with a thermally conductive material, e.g., plated copper, solder, thermally conductive adhesive, or other material having a thermal conductivity greater than the thermal conductivity of package body 128 to form thermal vias 130, 132, 134, respectively.

Although a laser-ablation process and a molding process for formation of via apertures 136, 138, 140 are set forth above, in other embodiments, other via apertures formation techniques are used. For example, via apertures 136, 138, 140 are formed using milling, mechanical drilling, chemical etching and/or other via aperture formation techniques.

As illustrated in FIG. 2, thermal via 130 extends between principal surface 128P of package body 128 and active surface 106 of electronic component 104. In accordance with this embodiment, thermal via 130 directly contacts active surface 106, e.g., directly contacts a passivation layer (dielectric protective layer) of electronic component 104.

Thermal via 130 has an upper, e.g., first, surface 130U and a lower, e.g., second, surface 130L. Upper surface 130U is parallel to and lies in the same plane as principal surface 128P of package body 128. Lower surface 130L is parallel to and lies in the same plane as active surface 106 of electronic component 104. As thermal via 130 directly contacts electronic component 104, thermal via 130 is sometimes called an electronic component direct contact thermal via.

Thermal via 130 extends between upper surface 130U and lower surface 130L. In accordance with this embodiment, upper surface 130U has a greater area than the area of lower surface 130L. Accordingly, thermal via 130 tapers from upper surface 130U to lower surface 130L. More particularly, the diameter of thermal via 130 in a plane parallel to principal surface 128P is greatest at upper surface 130U and smallest at lower surface 130L and gradually diminishes between upper surface 130U and lower surface 130L.

In another embodiment, thermal via 130 has a uniform diameter, i.e., has a cylindrical shape where lower surface 130L is equal in area to upper surface 130U. In yet another embodiment, thermal via 130 tapers from lower surface 130L to upper surface 130U. More particularly, the diameter of thermal via 130 in a plane parallel to principal surface 128P is smallest at upper surface 130U and greatest at lower surface 130L and gradually increases between upper surface 130U and lower surface 130L.

Thermal via 130 is formed within via aperture 136. In accordance with one embodiment, via aperture 136 is formed by laser-ablating package body 128 from principal surface 128P to active surface 106 of electronic component 104. Via aperture 136 is filled with a thermally conductive material to form thermal via 130 in direct contact with active surface 106.

Thermal via 130 contacts active surface 106 in a nonfunctional region 142, sometimes called a non-active area, of active surface 106. In one embodiment, nonfunctional region 142 is a portion of active surface 106 absent bond pads 110, e.g., the central portion of active surface 106 inward of bond pads 110. Nonfunctional region 142 is a dielectric surface, sometimes called a nonfunctional surface, of active surface 106 thus avoiding electrical coupling between electronic component 104 and thermal via 130. Accordingly, thermal via 130 is electrically isolated from electronic component 104, e.g., bond pads 110. Although nonfunctional region 142 is a nonfunctional region of active surface 106, in light of this disclosure, those of skill in the art will understand that transistors, electrical circuits and/or other electrical features are formed within electronic component 104 directly below nonfunctional region 142 in one embodiment.

As further illustrated in FIG. 2, thermal via 132 extends from principal surface 128P of package body 128 and is spaced from active surface 106 of electronic component 104. In accordance with this embodiment, thermal via 132 does not contact, i.e., is spaced apart from, active surface 106.

Thermal via 132 has an upper, e.g., first, surface 132U and a lower, e.g., second, surface 132L. Upper surface 132U is parallel to and lies in the same plane as principal surface 128P of package body 128. Lower surface 132L is parallel to but spaced apart from the plane of active surface 106 of electronic component 104 such that a spacer portion 144 of package body 128 exists between lower surface 132L and active surface 106. As thermal via 132 is spaced apart from electronic component 104, thermal via 132 is sometimes called an electronic component proximate thermal via.

Thermal via 132 extends between upper surface 132U and lower surface 132L. In accordance with this embodiment, upper surface 132U has a greater area than the area of lower surface 132L. Accordingly, thermal via 132 tapers from upper surface 132U to lower surface 132L. More particularly, the diameter of thermal via 132 in a plane parallel to principal surface 128P is greatest at upper surface 132U and smallest at lower surface 132L and gradually diminishes between upper surface 132U and lower surface 132L.

In another embodiment, thermal via 132 has a uniform diameter, i.e., has a cylindrical shape where lower surface 132L is equal in area to upper surface 132U. In yet another embodiment, thermal via 132 tapers from lower surface 132L to upper surface 132U. More particularly, the diameter of thermal via 132 in a plane parallel to principal surface 128P is smallest at upper surface 132U and greatest at lower surface 132L and gradually increases between upper surface 132U and lower surface 132L.

Thermal via 132 is formed within via aperture 138. In accordance with one embodiment, via aperture 138 is formed by laser-ablating package body 128 from principal surface 128P part of the way to active surface 106 of electronic component 104. More particularly, package body 128 is laser-ablated such that spacer portion 144 of package body 128 remains between via aperture 138 and active surface 106. In this manner, damage to active surface 106 and generally to electronic component 104 is avoided. Via aperture 136 is filled with a thermally conductive material to form thermal via 132 proximate with active surface 106, i.e., directly adjacent but spaced apart from active surface 106. Thermal via 132 is electrically isolated from electronic component 104, e.g., bond pads 110.

As set forth above, thermal vias 130, 132 extend from principal surface 128P through at least a portion of package body 128 and towards nonfunctional region 142 of active surface 106.

Thermal via 134 extends between principal surface 128P of package body 128 and heat spreader pad 126. In accordance with this embodiment, thermal via 134 directly contacts heat spreader pad 126.

Thermal via 134 has an upper, e.g., first, surface 134U and a lower, e.g., second, surface 134L. Upper surface 134U is parallel to and lies in the same plane as principal surface 128P of package body 128. Lower surface 134L is parallel to and lies in the same plane as heat spreader pad 126. As thermal via 134 directly contacts heat spreader pad 126, thermal via 134 is sometimes called a heat spreader pad direct contact thermal via.

Thermal via 134 extends between upper surface 134U and lower surface 134L. In accordance with this embodiment, upper surface 134U has a greater area than the area of lower surface 134L. Accordingly, thermal via 134 tapers from upper surface 134U to lower surface 134L. More particularly, the diameter of thermal via 134 in a plane parallel to principal surface 128P is greatest at upper surface 134U and smallest at lower surface 134L and gradually diminishes between upper surface 134U and lower surface 134L.

In another embodiment, thermal via 134 has a uniform diameter, i.e., has a cylindrical shape where lower surface 134L is equal in area to upper surface 134U. In yet another embodiment, thermal via 134 tapers from lower surface 134L to upper surface 134U. More particularly, the diameter of thermal via 134 in a plane parallel to principal surface 128P is smallest at upper surface 134U and greatest at lower surface 134L and gradually increases between upper surface 134U and lower surface 134L.

Thermal via 134 is formed within via aperture 140. In accordance with this embodiment, via aperture 140 is formed by laser-ablating package body 128 from principal surface 128P to heat spreader pad 126. Via aperture 140 is filled with a thermally conductive material to form thermal via 134 in direct contact with heat spreader pad 126.

Thermal via 134 contacts heat spreader pad 126. As set forth above, heat spreader pad 126 is electrically isolated thus avoiding electrical coupling between upper traces 114 and thermal via 134.

Although only a single thermal via 130, a single thermal via 132, and a single thermal via 134 are illustrated in FIG. 2, in light of this disclosure and FIG. 1, those of skill in the art will understand that a plurality of thermal vias 130, 132, 134 are formed in one embodiment. Further, although thermal vias 130, 132, and 134 are set forth above, in another embodiment, only thermal vias 130, thermal vias 132, or thermal vias 134 or combinations thereof are formed.

In one embodiment, thermal vias 130 are formed and thermal vias 132 are not when contact between thermal vias 130 and electronic component 104 is acceptable. In another embodiment when contact between a thermal via and electronic component 104 is unacceptable or otherwise undesirable, thermal vias 132 are formed and thermal vias 130 are not. In either case, thermal vias 134 are formed or not. In yet another embodiment, thermal vias 134 are formed and thermal vias 130, 132 are not.

Thermal via heat spreader package 100 further includes a heat spreader 146, e.g., plated copper, a copper slug, or other material having a high thermal conductivity, connected to thermal vias 130, 132, 134. Heat spreader 146 is not illustrated in FIG. 1 to allow visualization of thermal vias 130, 132 and 134.

In accordance with this embodiment, heat spreader 146 is formed on principal surface 128P of package body 128. More particularly, heat spreader 146 includes a lower, e.g., first, surface 146L and an opposite upper, e.g., second, surface 146U. Lower surface 146L is mounted to principal surface 128P of package body 128. Further, heat spreader 146 includes sides 146S extending perpendicularly between upper surface 146U and lower surface 146L.

In one embodiment, heat spreader 146 entirely covers principal surface 128P of package body 128 and is sometimes called a package edge heat spreader. In accordance with this embodiment, paying particular attention to the right side as thermal via heat spreader package 100 in the view of FIG. 2, sides 146S of heat spreader 146 are parallel to and lie in the same plane as sides 102S of substrate 102 and sides 128S of package body 128. Illustratively, thermal via heat spreader package 100 is formed simultaneously with a plurality of packages in an array or strip. The array or strip is singulated resulting in sides 102S, 128S, and 146S of substrate 102, package body 128, and heat spreader 146, respectively, being parallel and coplanar.

In accordance with another embodiment, paying particular attention to the left side of thermal via heat spreader package 100 in the view of FIG. 2, sides 146S of heat spreader 146 are inward of sides 128S of package body 128. In accordance with this embodiment, heat spreader 146 only partially covers principal surface 128P and is sometimes referred to as an inboard heat spreader.

Generally, heat spreader 146 either entirely or partially covers principal surface 128P of package body 128 depending upon the particular embodiment. In the embodiment where heat spreader 146 entirely covers principal surface 128P, sides 146S are parallel and coplanar with sides 128S as indicated at the right side of thermal via heat spreader package 100 in the view of FIG. 2 and the dashed line at the left side of thermal via heat spreader package 100 in the view of FIG. 2.

In the embodiment where heat spreader 146 partially covers principal surface 128P, sides 146S are inwards of sides 128S as indicated at the left side of thermal via heat spreader package 100 in the view of FIG. 2. Accordingly, although side 146S is illustrated as being parallel and coplanar with side 128S at the right side and side 146S is illustrated as being inwards of side 128S at the left side of thermal via heat spreader package 100 in the view of FIG. 2, typically, all sides 146S are either parallel and coplanar with sides 128S or inwards of side 128S. Accordingly, heat spreader 146 is set forth in FIG. 2 in accordance with various different embodiments for purposes of illustration.

Heat spreader 146 is thermally connected to thermal vias 130, 132, 134. In one embodiment, heat spreader 146 directly contacts thermal vias 130, 132, 134. In another embodiment, a thermal interface material, e.g., a thermally conductive adhesive, grease, paste, solder, or other material having a high thermal conductivity, is between heat spreader 146 and thermal vias 130, 132, 134 and thermally connects heat spreader 146 to thermal vias 130, 132, 134. In one embodiment where thermal vias 130, 132, 134 are solder, the lower surface of heat spreader 146 is solder wettable thus allowing thermal vias 130, 132, 134 to be reflowed and directly connected to heat spreader 146.

Accordingly, heat generated by electronic component 104 is dissipated to thermal vias 130 and to heat spreader 146. Further, heat generated by electronic component 104 is dissipated through spacer portion 144 to thermal vias 132 and to heat spreader 146. Thermal vias 132 are close enough to electronic component 104 to still effectively transfer heat.

Still further, heat generated by electronic component 104 is dissipated through adhesive 112 to substrate 102, to heat spreader pads 126, to thermal vias 134, and to heat spreader 146. Heat spreader 146 dissipates the heat to the ambient environment.

In one embodiment, electronic component 104 has at least one hotspot 148. Hotspot 148 is a region of electronic component 104 that generate more heat and thus is hotter than the other regions of electronic component 104. Illustratively, hotspot 148 includes active circuitry, e.g., transistors, whereas other regions of electronic component 104 include inactive circuitry, e.g., signal traces. In light of this disclosure, those of skill in the art will understand that a hotspot 148 is created due to any one of a number of designs of electronic component 104.

In accordance with this embodiment, the density of thermal vias 130, 132, i.e., the number of thermal vias 130, 132 per unit area of active surface 106 of electronic component 104, is increased in hotspot 148 thus maximizing heat transfer from hotspot 148. More particularly, hotspot 148 is specifically targeted with thermal vias 130, 132. In this manner, optimal heat transfer from electronic component 104 is achieved.

In another embodiment, thermal via heat spreader package 100 is formed without heat spreader 146. In accordance with this embodiment, a customer purchasing thermal via heat spreader package 100 can attach heat spreader 146 at the customer's facility, if desired.

Figure 3:
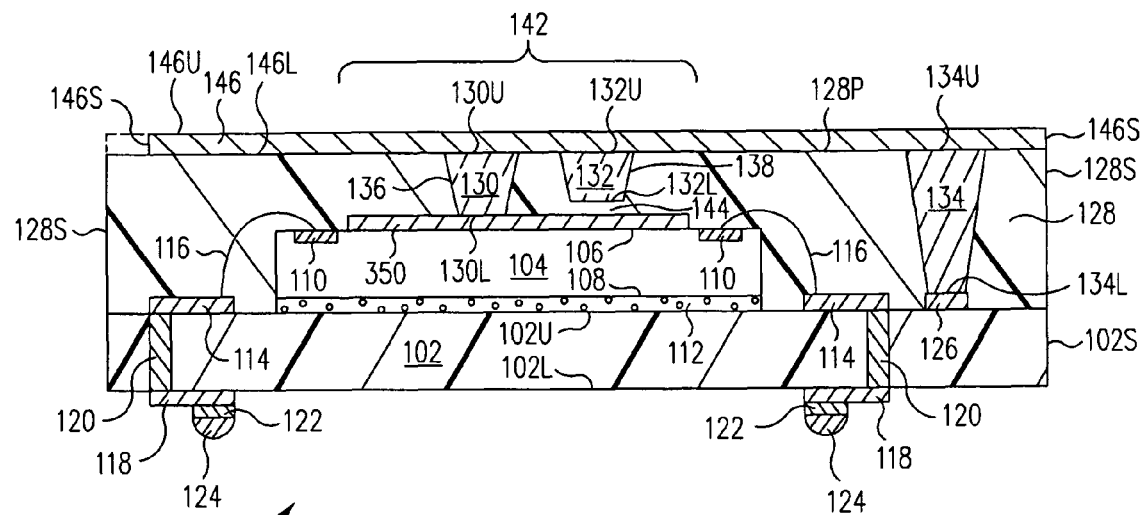
FIG. 3 is a cross-sectional view of a thermal via heat spreader package in accordance with another embodiment.

FIG. 3 is a cross-sectional view of a thermal via (thermal via) heat spreader package 300 in accordance with another embodiment. Thermal via heat spreader package 300 of FIG. 3 is similar to thermal via heat spreader package 100 of FIG. 2 and only the significant differences between thermal via heat spreader package 300 and thermal via heat spreader package 100 are discussed below.

Referring now to FIG. 3, in accordance with this embodiment, thermal via heat spreader package 300 includes a protective layer 350 mounted to active surface 106 of electronic component 104. In one embodiment, protective layer 350 self-adheres to active surface 106, e.g., is or includes an adhesive or is plated. In another embodiment, protective layer 350 is mounted to active surface 106 using an adhesive.

Protective layer 350 is on a central portion of active surface 106 inwards of bond pads 110. More particularly, in accordance with one embodiment, protective layer 350 is on non-functional region 142 of active surface 106 thus avoiding electrical coupling between electronic component 104 and protective layer 350.

In accordance with this embodiment, thermal via 130 extends between principal surface 128P of package body 128 and protective layer 350. Thermal via 130 directly contacts protective layer 350. More particularly, lower surface 130L is parallel to and lies in the same plane as protective layer 350, i.e., the upper surface thereof. As thermal via 130 directly contacts protective layer 350, thermal via 130 is sometimes called a protective layer direct contact thermal via.

Thermal via 130 is formed within via aperture 136. In accordance with one embodiment, via aperture 136 is formed by laser-ablating package body 128 from principal surface 128P to protective layer 350. Protective layer 350 protects electronic component 104 during this laser-ablation process, i.e., prevents laser-ablation and the associated damage of electronic component 104. Via aperture 136 is filled with a thermally conductive material to form thermal via 130 in direct contact with protective layer 350.

As further illustrated in FIG. 3, thermal via 132 extends from principal surface 128P of package body 128 to be spaced from protective layer 350. In accordance with this embodiment, thermal via 132 does not contact, i.e., is spaced apart from, protective layer 350.

Lower surface 132L of thermal via 132 is parallel to but spaced apart from the plane of protective layer 350, i.e., the upper surface thereof, such that spacer portion 144 of package body 128 exists between lower surface 132L and protective layer 350. As thermal via 132 is spaced apart from protective layer 350, thermal via 132 is sometimes called a protective layer proximate thermal via.

Thermal via 132 is formed within via aperture 138. In accordance with one embodiment, via aperture 138 is formed by laser-ablating package body 128 from principal surface 128P part of the way to protective layer 350. More particularly, package body 128 is laser-ablated such that spacer portion 144 of package body 128 remains between via aperture 138 and protective layer 350. In this manner, damage to protective layer 350 and generally to electronic component 104 is avoided. Via aperture 136 is filled with a thermally conductive material to form thermal via 132 proximate with protective layer 350, i.e., directly adjacent but spaced apart from protective layer 350.

In one embodiment, protective layer 350 is a copper spacer or other material having a high thermal conductivity and/or is an electrical conductor. In accordance with this embodiment, heat generated by electronic component 104 is dissipated to protective layer 350, to thermal vias 130, 132, and to heat spreader 146 and the ambient environment.

In one specific example, protective layer 350 is a copper coating on active surface 106 that acts as a stop for the laser used during the laser-ablation process that forms thermal vias 130. More particularly, the laser-ablation process is performed until the laser reaches protective layer 350, i.e., the copper coating in accordance with this embodiment. Upon reaching protective layer 350, reflection of the laser or other indicator that protective layer 350 has been reached is detected and the laser-ablation process is stopped or moved to the formation of the next via aperture.

In accordance with another embodiment, protective layer 350 is a dielectric material. In accordance with this embodiment, protective layer 350 protects electronic component 104 during the laser ablation process used to form thermal vias 130, 132. Further, protective layer 350 electrically isolates thermal via 130 from electronic component 104.

Figure 4:
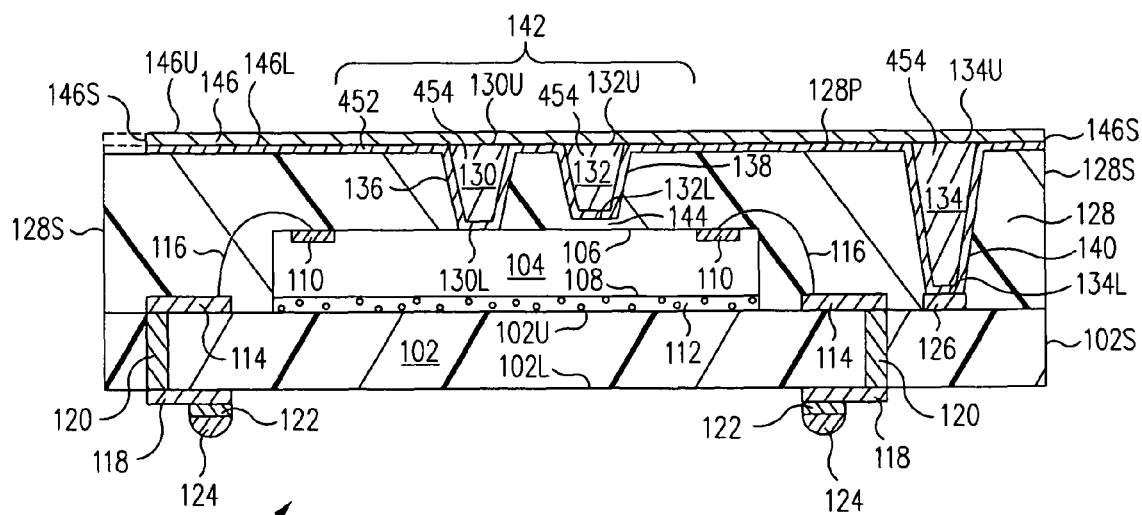
FIGS. 4, 5, 6 are cross-sectional views of thermal via heat spreader packages in accordance with various embodiments.

FIG. 4 is a cross-sectional view of a thermal via heat spreader package 400 in accordance with another embodiment. Thermal via heat spreader package 400 of FIG. 4 is similar to thermal via heat spreader package 100 of FIG. 2 and only the significant differences between thermal via heat spreader package 400 and thermal via heat spreader package 100 are discussed below.

Referring now to FIG. 4, in accordance with this embodiment, thermal via heat spreader package 400 includes a metal plating layer 452, e.g., a copper plating. In accordance with this embodiment, after formation of via apertures 136, 138, 140, metal plating layer 452 is formed, e.g., by plating.

Metal plating layer 452 entirely or partially covers principal surface 128P of package body 128 and lines via apertures 136, 138, 140, i.e., the sidewalls thereof.

Thermal via heat spreader package 400 further includes a via filling material 454 that fills via apertures 136, 138, 140. Via filling material 454, e.g., a thermally conductive epoxy, fills the remainder of via apertures 136, 138, 140 that is not already filled with metal plating layer 452. More particularly, via filling material 454 is formed on metal plating layer 452. Accordingly, metal plating layer 452 and via filling material 454 forms thermal vias 130, 132, 134.

Heat spreader 146 is mounted to metal plating layer 452. In one embodiment, via filling material 454, e.g., a thermally conductive epoxy, mounts heat spreader 146 to metal plating layer 452.

Figure 5:
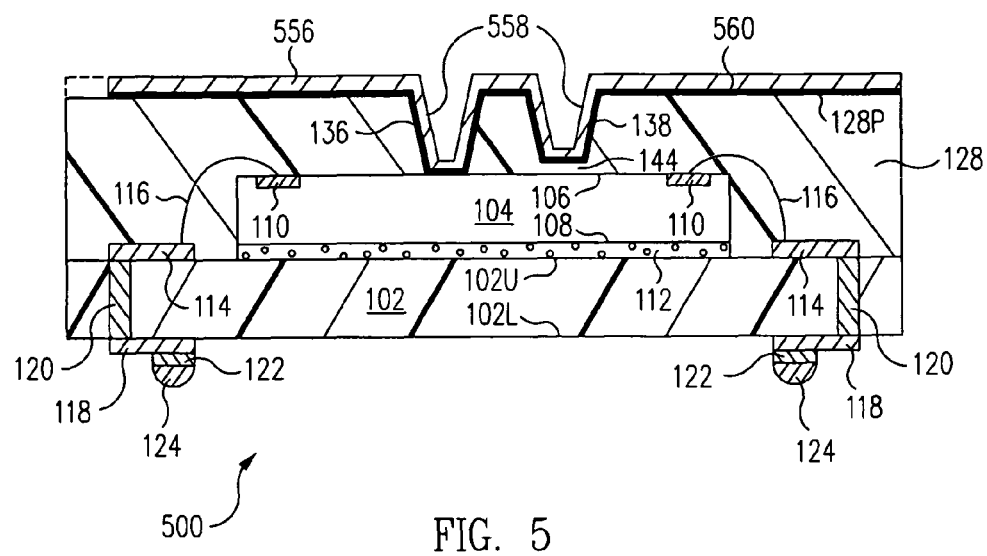

FIG. 5 is a cross-sectional view of a thermal via heat spreader package 500 in accordance with another embodiment. Thermal via heat spreader package 500 of FIG. 5 is similar to thermal via heat spreader package 100 of FIG. 2 and only the significant differences between thermal via heat spreader package 500 and thermal via heat spreader package 100 are discussed below.

Referring now to FIG. 5, in accordance with this embodiment, thermal via heat spreader package 500 includes a stamped heat spreader 556. Stamped heat spreader 556 is a stamped piece a metal, e.g., copper. More particularly, stamped heat spreader 556 is formed by stamping a sheet of metal to form bumps 558, i.e., protrusions, using any one of a number of stamping techniques, and the particular technique used is not essential to this embodiment. The pattern of bumps 558 corresponds with the pattern of thermal vias 130, 132 (and thermal vias 134 if formed as illustrated in FIG. 2).

Thermal via heat spreader package 500 further includes an adhesive 560, e.g., a thermally conductive epoxy. Adhesive 560 mounts stamped heat spreader 556 to package body 128 and within via apertures 136, 138 (and via apertures 140 if formed as illustrated in FIG. 2). In the embodiment illustrated in FIG. 5, adhesive 560 is between the entire stamped heat spreader 556 and package body 128. However, in other embodiments, adhesive 560 is selectively applied, e.g., only within via apertures 136, 138.

Figure 6:
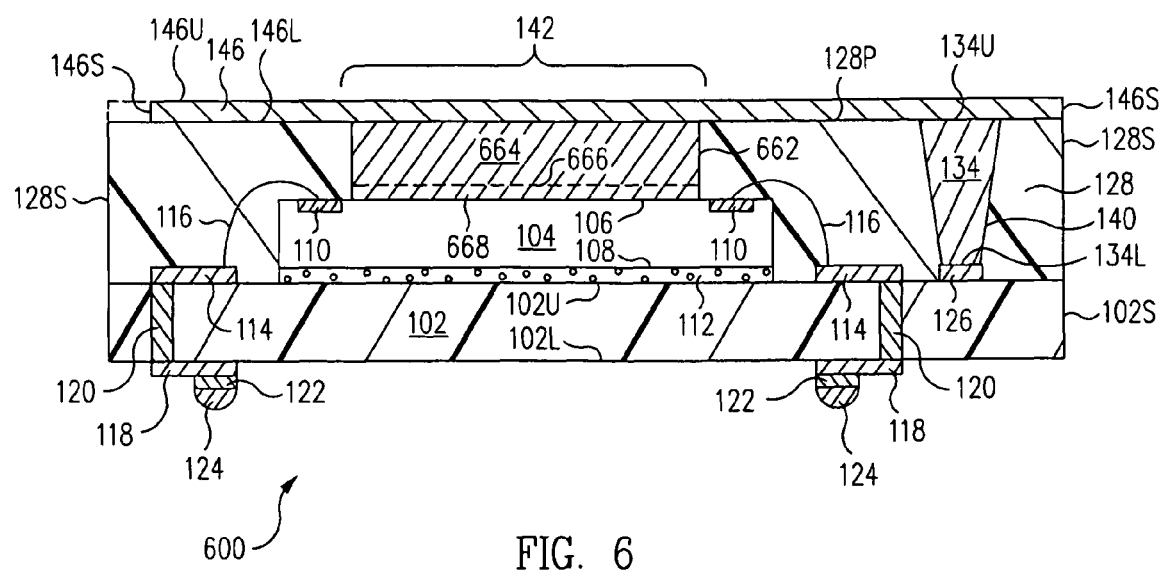

FIG. 6 is a cross-sectional view of a thermal via heat spreader package 600 in accordance with another embodiment. Thermal via heat spreader package 600 of FIG. 6 is similar to thermal via heat spreader package 100 of FIG. 2 and only the significant differences between thermal via heat spreader package 600 and thermal via heat spreader package 100 are discussed below.

Referring now to FIG. 6, in accordance with this embodiment, thermal via heat spreader package 600 includes a large via aperture 662 and a thermal via 664 formed therein. Although via aperture 662 is illustrated as having sidewalls perpendicular to active surface 106, in another embodiment, via aperture 662 includes tapered sidewalls.

In one embodiment, thermal via 664 is formed using a laser-ablation process. Illustratively, package body 128 is removed, e.g., using laser-ablation, over the entire central portion of active surface 106 inward a bond pads 110, e.g., above nonfunctional region 142, to form via aperture 662. More particularly, a laser is directed at principal surface 128P perpendicularly to principal surface 128P. This laser ablates, i.e., removes, the portion of package body 128 above nonfunctional region 142 leaving via aperture 662.

In another embodiment, via aperture 662 is formed during the molding process used to form package body 128. For example, after formation of bond wires 116, the assembly is placed in a mold having a plug or other protrusion corresponding to via aperture 662. Molding compound is introduced into the mold and around the plug or other protrusion corresponding to via aperture 662. After the molding compound solidifies, the assembly is removed from the mold. Via aperture 662 is created by the void left behind from the removal of the plug or other protrusion. Via aperture 662 is sometimes called a molded dimple in accordance with this embodiment.

In either embodiment, via aperture 662 is then filled with a thermally conductive material, e.g., plated copper, solder, thermally conductive adhesive, or other material having a thermal conductivity greater than the thermal conductivity of package body 128 to form thermal via 664.

Although a laser-ablation process and a molding process for formation of via aperture 662 is set forth above, in other embodiments, other via aperture formation techniques are used. For example, via aperture 662 is formed using milling, mechanical drilling, chemical etching and/or other via aperture formation techniques.

As illustrated in FIG. 6, thermal via 664 extends between principal surface 128P of package body 128 and active surface 106 of electronic component 104. In accordance with this embodiment, thermal via 664 directly contacts active surface 106, e.g., directly contacts a passivation layer (dielectric protective layer) of electronic component 104. However, in accordance with another embodiment, thermal via 664 does not contact, i.e., is spaced apart from, active surface 106 as indicated by the dashed line 666. In accordance with this embodiment, a spacer portion 668 of package body 128 exists between thermal via 664 and active surface 106.

Figure 7:
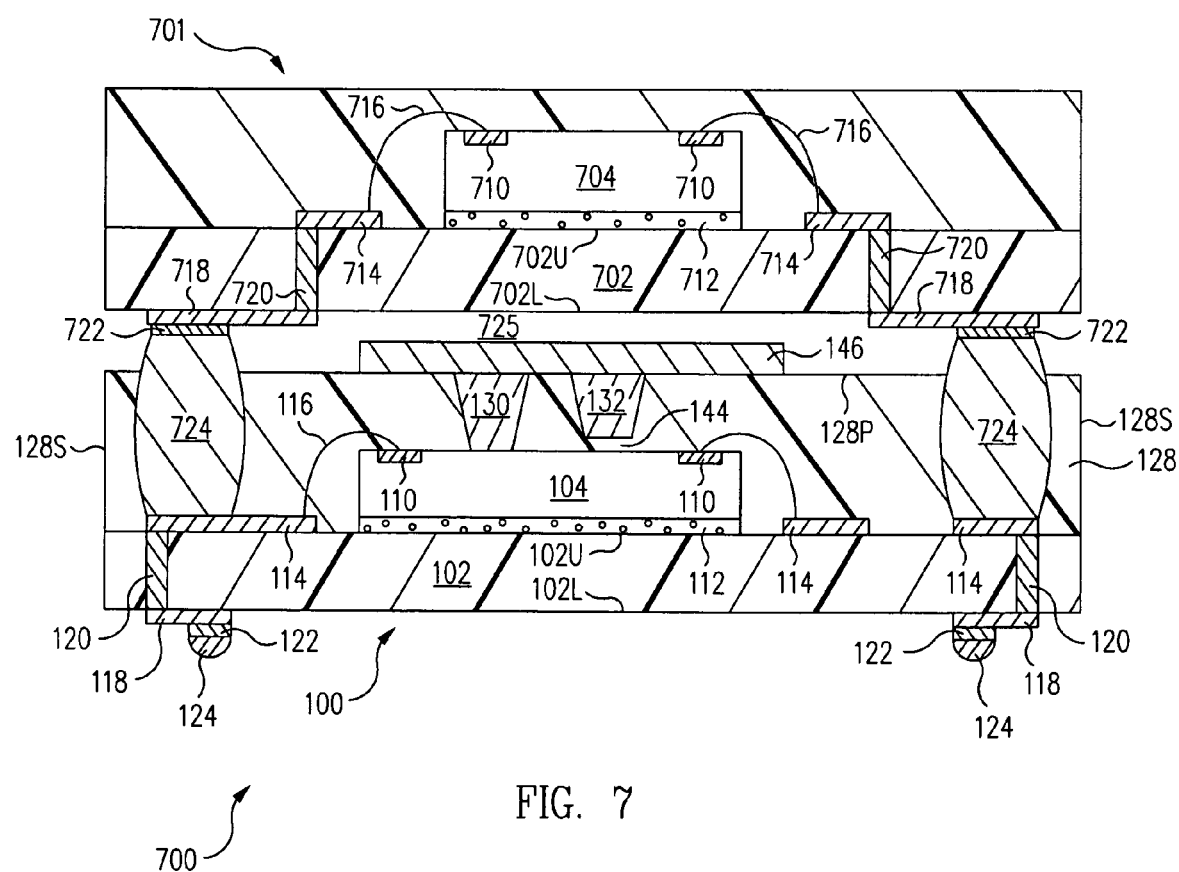
FIGS. 7, 7A are cross-sectional views of stacked thermal via heat spreader packages including the thermal via heat spreader package of FIGS. 1 and 2 in accordance with various embodiments.

FIG. 7 is a cross-sectional view of a stacked thermal via heat spreader package 700 including thermal via heat spreader package 100 of FIGS. 1 and 2 in accordance with another embodiment.

Referring now to FIG. 7, in accordance with this embodiment, stacked thermal via heat spreader package 700 includes a second package 701 stacked on thermal via heat spreader package 100. Thermal via heat spreader package 100 is similar or identical to thermal via heat spreader package 100 of FIGS. 1 and 2 and so the description thereof is not repeated for purposes of simplicity of discussion. Heat spreader 146 is inward of sides 128S in accordance with this embodiment.

Second package 701 includes a substrate 702 having upper and lower surfaces 702U, 702L, an electronic component 704 having bond pads 710, an adhesive 712, bond wires 716, upper traces 714, lower traces 718, vias 720, and pads 722 similar to substrate 102 having upper and lower surfaces 102U, 102L, electronic component 104 having bond pads 110, adhesive 112, bond wires 116, upper traces 114, lower traces 118, vias 120, and pads 122 of thermal via heat spreader package 100, respectively, and so the description thereof is not repeated for purposes of simplicity of discussion.

In accordance with this embodiment, second package 701 is mounted to thermal via heat spreader package 100 with interconnection balls 724, e.g., solder. Interconnection balls 724 extend between upper traces 104 of thermal via heat spreader package 100 and pads 722 of second package 701. Interconnection balls 724 extend through package body 128 of thermal via heat spreader package 100.

Although a particular second package 701 is set forth, in light of this disclosure, those of skill in the art will understand that any one of a number of electronic component packages can be stacked on thermal via heat spreader package 100 in a similar manner.

As illustrated in FIG. 7, second package 701 is mounted above thermal via heat spreader package 100 by interconnection balls 724 such that there is a separation 725, sometimes called space, between second package 701 and thermal via heat spreader package 100. More particularly, separation 725 is between lower surface 702L of substrate 702 of second package 701 and principal surface 128P/heat spreader 146 of thermal via heat spreader package 100.

Figure 7A:
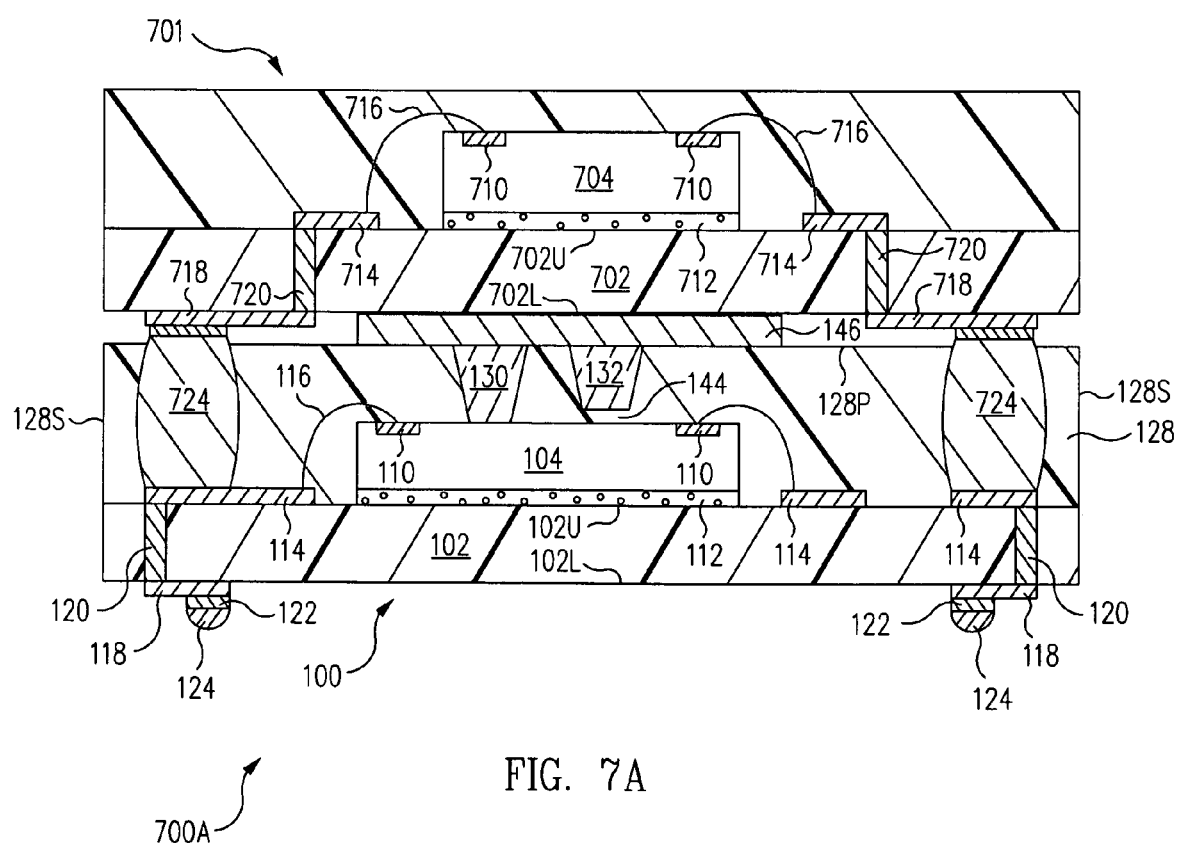

FIG. 7A is a cross-sectional view of a thermal via heat spreader package 700A in accordance with another embodiment. Thermal via heat spreader package 700A of FIG. 7A is similar to thermal via heat spreader package 700 of FIG. 7 and only the significant differences between thermal via heat spreader package 700A and thermal via heat spreader package 700 are discussed below.

In accordance with this embodiment, second package 701 is mounted directly to thermal via heat spreader package 100 such that there is no separation between second package 701 and thermal via heat spreader package 100. More particularly, lower surface 702L of substrate 702 of second package 701 is mounted to principal surface 128P of thermal via heat spreader package 100 through heat spreader 146.

Figure 8:
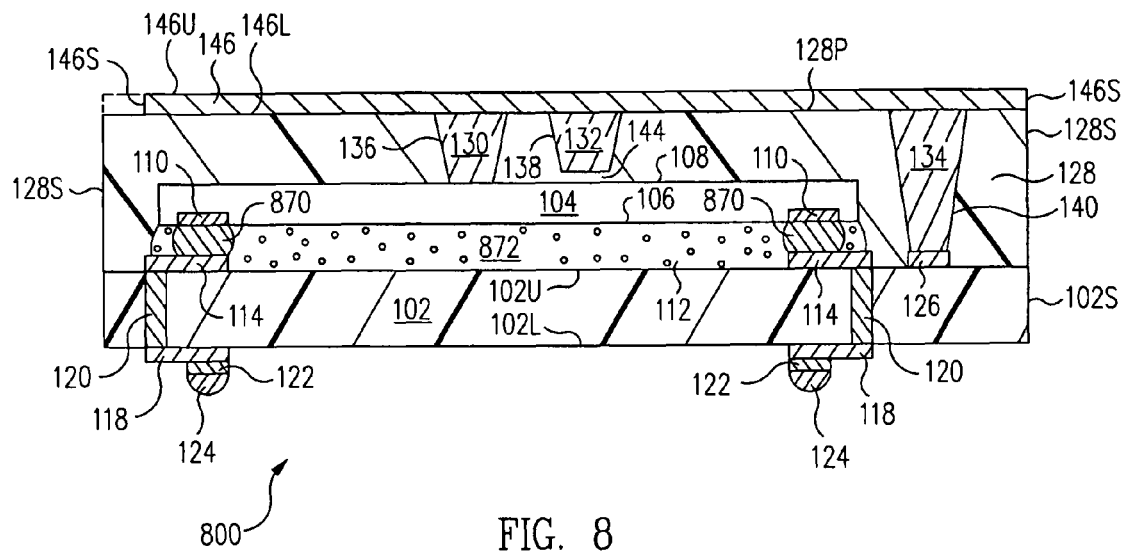
FIGS. 8, 9, 10, 11 are cross-sectional views of thermal via heat spreader packages in accordance with various embodiments.

FIG. 8 is a cross-sectional view of a thermal via heat spreader package 800 in accordance with another embodiment. Thermal via heat spreader package 800 of FIG. 8 is similar to thermal via heat spreader package 100 of FIG. 2 and only the significant differences between thermal via heat spreader package 800 and thermal via heat spreader package 100 are discussed below.

Referring now to FIG. 8, in accordance with this embodiment, thermal via heat spreader package 800 includes electronic component 104 mounted in a flip chip configuration. More particularly, bond pads 110 are mounted to upper traces 114 by electrically conductive flip chip bumps 870.

As also illustrated in FIG. 8, in one embodiment, an underfill 872 is applied. Underfill 872 fills the space between active surface 106 of electronic component 104 and upper surface 102U of substrate 102. Underfill 872 encloses and protects flip chip bumps 870. Underfill 872 is optional, and in one embodiment, is not formed.

In accordance with this embodiment, thermal via 130 directly contacts inactive surface 108 of electronic component 104 in a manner similar to that discussed above regarding thermal via 130 and active surface 106 of thermal via heat spreader package 100 of FIGS. 1 and 2. Further, thermal via 132 is spaced apart from inactive surface 108 of electronic component 104 by spacer portion 144 of package body 128 in a manner similar to that discussed above regarding thermal via 132, active surface 106 and spacer portion 144 of thermal via heat spreader package 100 of FIGS. 1 and 2.

Figure 9:
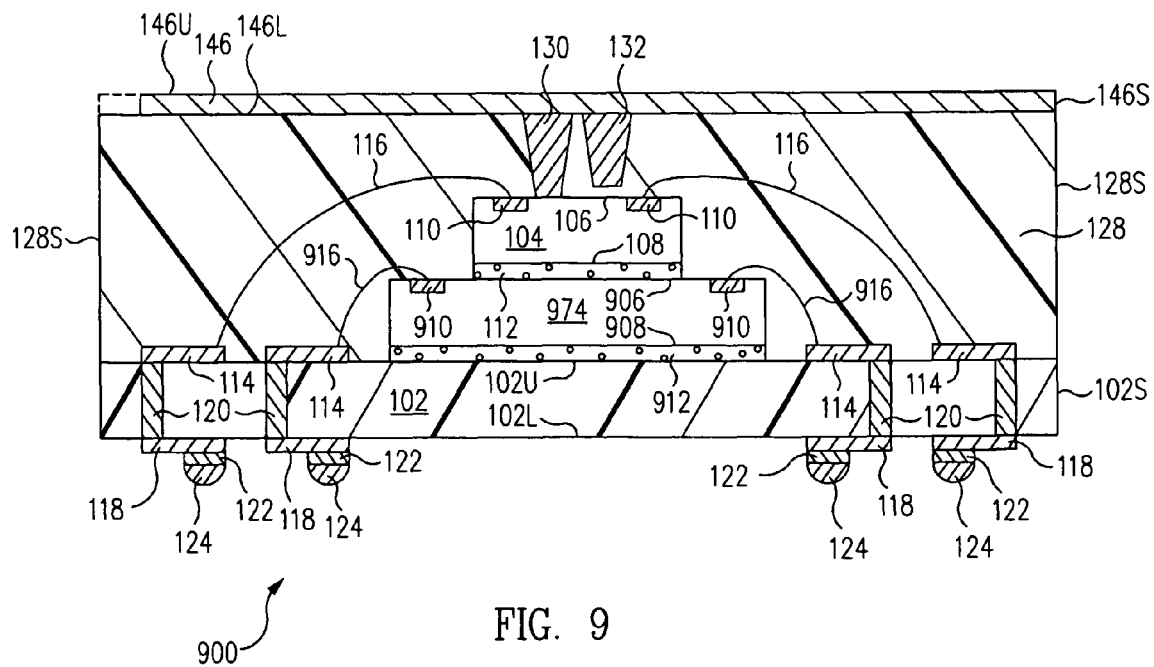

FIG. 9 is a cross-sectional view of a thermal via heat spreader package 900 in accordance with another embodiment. Thermal via heat spreader package 900 of FIG. 9 is similar to thermal via heat spreader package 100 of FIG. 2 and only the significant differences between thermal via heat spreader package 900 and thermal via heat spreader package 100 are discussed below.

Referring now to FIG. 9, in accordance with this embodiment, thermal via heat spreader package 900 includes a second electronic component 974. Electronic component 104, sometimes called a first electronic component, is stacked on second electronic component 974.

In one embodiment, second electronic component 974 is an integrated circuit chip, e.g., an active component. However, in other embodiments, second electronic component 974 is a passive component such as a capacitor, resistor, or inductor.

In accordance with this embodiment, second electronic component 974 includes an active surface 906 and an opposite inactive surface 908. Second electronic component 974 further includes bond pads 910 formed on active surface 906. Inactive surface 908 is mounted to upper surface 102U of substrate 102 with an adhesive 912, sometimes called a die attach adhesive. Bond pads 910 are electrically connected to upper traces 114 by electrically conductive bond wires 916.

Inactive surface 108 of electronic component 104 is mounted to active surface 906 of second electronic component 974 with adhesive 112. As illustrated in FIG. 9, in accordance with this embodiment, electronic component 104 is mounted to second electronic component 974 inward of bond pads 910. Package body 128 further encloses second electronic component 974 and bond wires 916.

Figure 10:
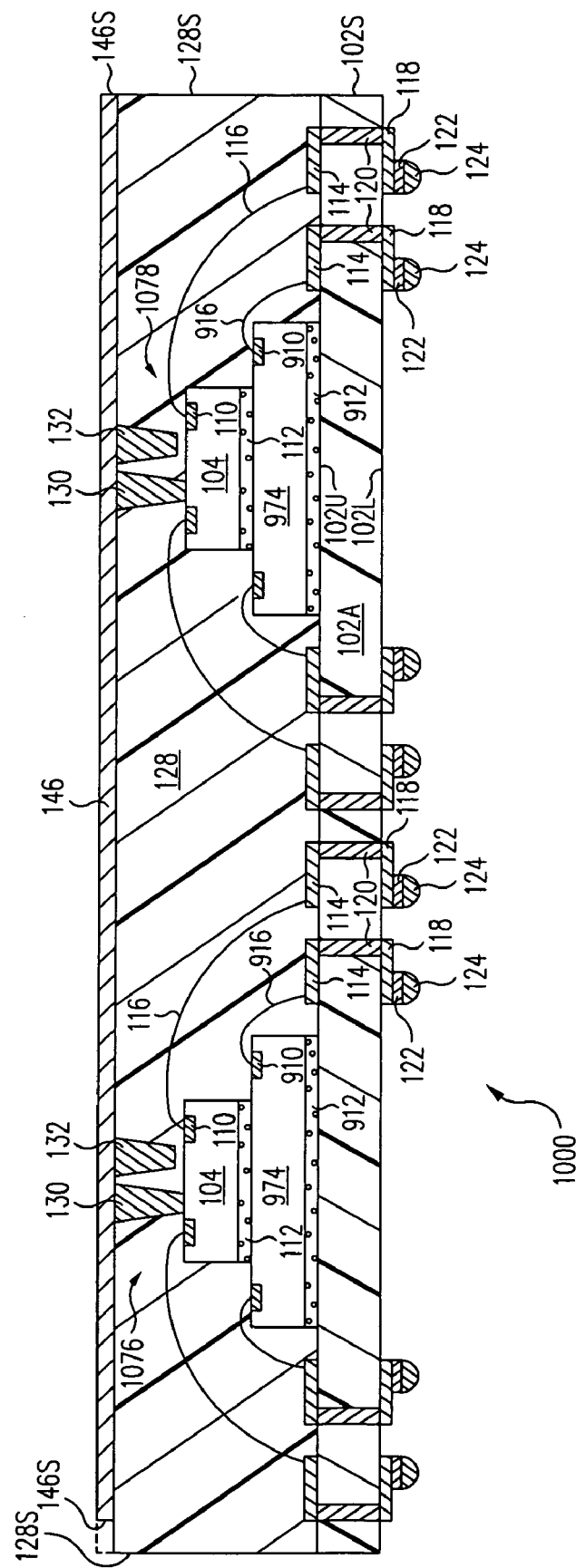

FIG. 10 is a cross-sectional view of a thermal via heat spreader package 1000 in accordance with another embodiment. Thermal via heat spreader package 1000 of FIG. 10 is similar to thermal via heat spreader package 900 of FIG. 9 and only the significant differences between thermal via heat spreader package 1000 and thermal via heat spreader package 900 are discussed below.

Referring now to FIG. 10, in accordance with this embodiment, thermal via heat spreader package 1000 is a stacked multi-chip module. More particularly, a substrate 102A includes a first stack 1076 of electronic components 104, 974 and a second stack 1078 of electronic components 104, 974. First stack 1076 is laterally adjacent second stack 1078.

Figure 11:
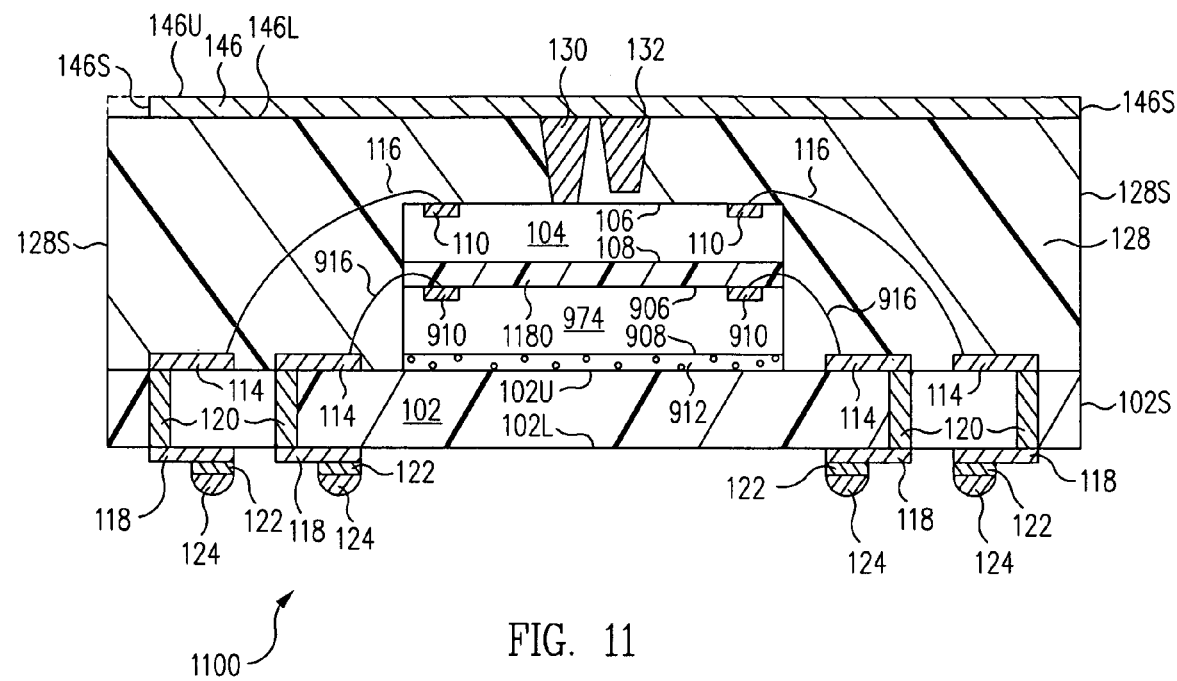

FIG. 11 is a cross-sectional view of a thermal via heat spreader package 1100 in accordance with another embodiment. Thermal via heat spreader package 1100 of FIG. 11 is similar to thermal via heat spreader package 900 of FIG. 9 and only the significant differences between thermal via heat spreader package 1100 and thermal via heat spreader package 900 are discussed below.

Referring now to FIG. 11, in accordance with this embodiment, electronic component 104 is mounted to second electronic component 974 above bond pads 910. In one embodiment, electronic component 104 is the same size as, or greater than, second electronic component 974 and thus is located vertically above bond pads 910.

Electronic component 104 is mounted to second electronic component 974 using a spacer 1180, sometimes called a film-on-wire spacer. More particularly, inactive surface 108 of electronic component 104 is mounted to active surface 906 of second electronic component 974 by spacer 1180.

Spacer 1180 directly contacts and encloses bond pads 910 and a portion of bond wires 916. Spacer 1180 is a dielectric material in accordance with this embodiment. Spacer 1180 spaces inactive surface 108 of electronic component 104 above the loop height of bond wires 910.

In accordance with this embodiment, spacer 1180 is a thermal insulator thus restricting heat flow from electronic component 104 down through spacer 1180. However, as discussed above, heat is readily dissipated from electronic component 104 to thermal vias 130, 132 and to heat spreader 146.

Figure 12:
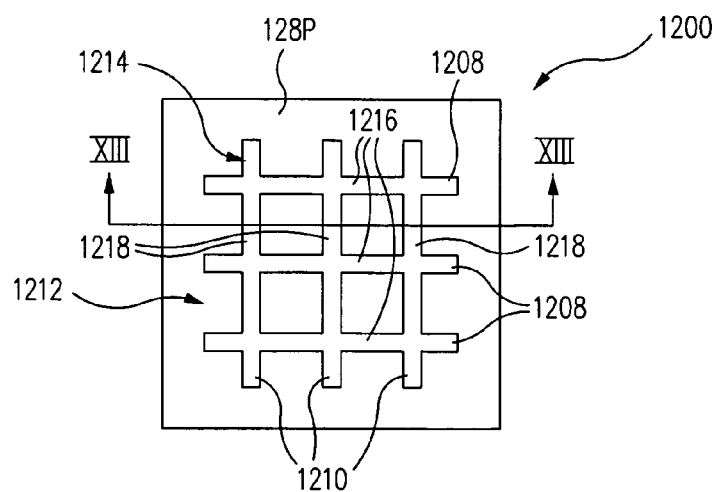
FIG. 12 is top plan view of a thermal via heat spreader package in accordance with one embodiment.
Figure 13:
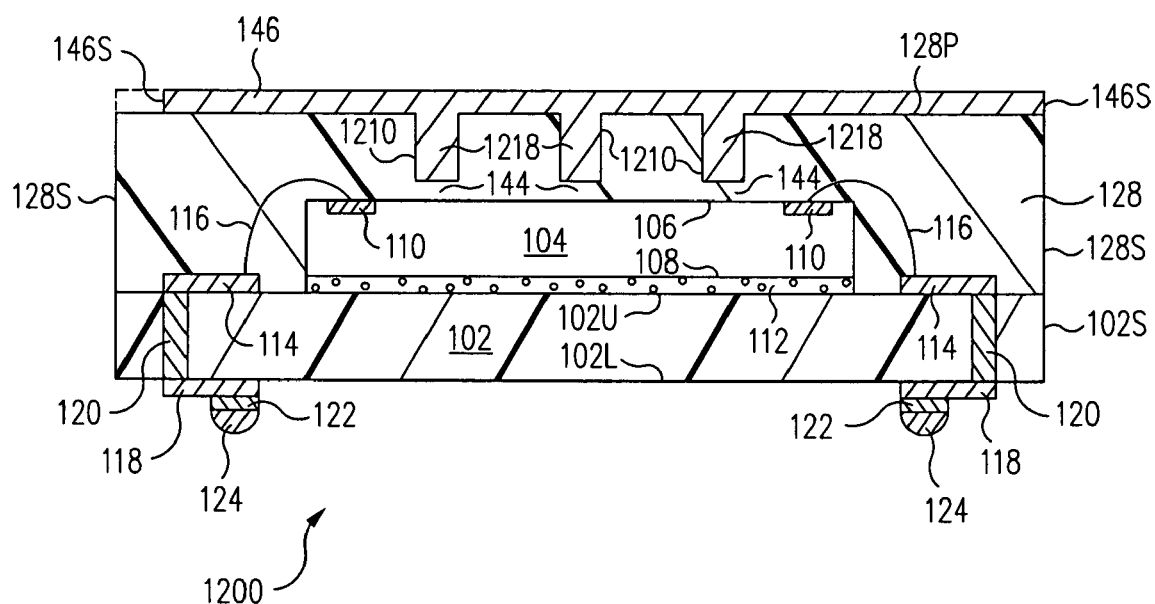
FIG. 13 is a cross-sectional view of the thermal via heat spreader package along the line XIII-XIII of FIG. 12 in accordance with one embodiment.

FIG. 12 is top plan view of a thermal via heat spreader package 1200 in accordance with one embodiment. FIG. 13 is a cross-sectional view of thermal via heat spreader package 1200 along the line XIII-XIII of FIG. 12 in accordance with one embodiment.

Thermal via heat spreader package 1200 of FIGS. 12, 13 is similar to thermal via heat spreader package 100 of FIGS. 1 and 2 and only the significant differences between thermal via heat spreader package 1200 and thermal via heat spreader package 100 are discussed below.

Referring now to FIGS. 12, 13, in accordance with this embodiment, a plurality of horizontal grooves 1208 and a plurality of vertical grooves 1210 are formed in package body 128. Horizontal grooves 1208 extend in a first direction and vertical grooves 1210 extended in a second direction perpendicular to the first direction. Horizontal grooves 1208 intersect vertical grooves 1210 in a checkerboard pattern 1212.

In various embodiments, checkerboard pattern 1212 is formed in package body 128 using an acid etching process, a milling process, a molding process, and/or a laser-ablation process. After formation of checkerboard pattern 1212, i.e., after formation of horizontal grooves 1208 and vertical grooves 1210, a thermally conductive material, e.g., copper, is plated to fill the checkerboard pattern 1212 and cover principal surface 128P.

The thermally conductive material in checkerboard pattern 1212 forms a checkerboard thermal via 1214 in the form of horizontal strips 1216 and vertical strips 1218. More particularly, horizontal strips 1216 are formed within horizontal grooves 1208. Similarly, vertical strips 1218 are formed in vertical grooves 1210. Horizontal strips 1216 intersect vertical strips 1218 forming checkerboard thermal via 1214.

Further, the thermally conductive material on principal surface 128P forms heat spreader 146. As checkerboard thermal via 1214 and heat spreader 146 are formed during a single plating operation in one embodiment, checkerboard thermal via 1214 and heat spreader 146 are integral, i.e., are a single piece and not a plurality of separate pieces connected together.

Checkerboard thermal via 1214 is spaced apart from active surface 106 of electronic component by spacer portion 144 in accordance with this embodiment. However, in another embodiment, checkerboard thermal via 1214 extends entirely through package body 128 and directly contacts active surface 106.

Although various embodiments are described above regarding FIGS. 1-13, in light of this disclosure, those of skill in the art will understand that various features can be interchanged between the embodiments. For example, protective layer 350 of FIG. 3 can be formed in any of the embodiments in the other figures.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A thermal via heat spreader package comprising:
   an electronic component comprising an active surface comprising a nonfunctional region;
   a package body enclosing the electronic component, the package body comprising a principal surface; and
   a thermal via extending from the principal surface through at least a portion of the package body and towards the nonfunctional region, wherein the thermal via extends between the principal surface and the active surface and directly contacts the nonfunctional region of the active surface.

2. The thermal via heat spreader package of claim 1 wherein the thermal via comprises a material having a thermal conductivity greater than a thermal conductivity of the package body.

3. The thermal via heat spreader package of claim 2 wherein the thermal via comprises a material selected from the group consisting of copper, solder, and thermally conductive adhesive.

4. The thermal via heat spreader package of claim 1 wherein the thermal via is formed within a via aperture formed in the package body.

5. The thermal via heat spreader package of claim 1 wherein the nonfunctional region comprises a dielectric surface, the thermal via being electrically isolated from the electronic component.

6. A thermal via heat spreader package comprising:
an electronic component comprising an active surface comprising a nonfunctional region;
a package body enclosing the electronic component, the package body comprising a principal surface; and
a thermal via extending from the principal surface through at least a portion of the package body and towards the nonfunctional region, wherein the thermal via extends between the principal surface and the active surface, wherein the thermal via has a first surface and a second surface, the first surface being parallel to and lying in a same plane as the principal surface of the package body, the second surface being parallel to and lying in a same plane as the active surface of the electronic component.

7. The thermal via heat spreader package of claim 6 wherein an area of the first surface is greater than an area of the second surface.

8. The thermal via heat spreader package of claim 1 further comprising:
a substrate comprising a first surface, wherein the electronic component is mounted to the first surface of the substrate;
a heat spreader pad on the first surface of the substrate; and
a thermal via extending through the package body from the principal surface and directly contacting the heat spreader pad.

9. The thermal via heat spreader package of claim 8 further comprising:
traces on the first surface of the substrate; and
bond wires electrically connecting bond pads of the electronic component to the traces.

10. The thermal via heat spreader package of claim 9 wherein the heat spreader pad is electrically isolated from the traces, the bond wires, and the bond pads.

11. The thermal via heat spreader package of claim 1 further comprising a heat spreader thermally connected to the thermal via.

12. A thermal via heat spreader package comprising:
a first electronic component comprising:
an active surface comprising a nonfunctional region; and
an inactive surface;
a second electronic component comprising:
an active surface; and
an inactive surface;
wherein the inactive surface of the first electronic component is mounted to the active surface of the second
a package body enclosing the first electronic component and the second electronic component, the package body comprising a principal surface; and
a thermal via extending from the principal surface through at least a portion of the package body and towards the nonfunctional region.

13. The thermal via heat spreader package of claim 12 further comprising:
a substrate comprising a first surface, wherein the inactive surface of the second electronic component is mounted to the first surface of the substrate;
a heat spreader pad on the first surface of the substrate; and
a thermal via extending through the package body from the principal surface and directly contacting the heat spreader pad.

14. A thermal via heat spreader package comprising:
an electronic component mounted to a substrate, the electronic component comprising an active surface comprising a nonfunctional region;
a package body enclosing the electronic component, the package body comprising a principal surface;
a via aperture extending from the principal surface through at least a portion of the package body and towards the nonfunctional region;
a thermal via formed by filling the via aperture with a material having a greater thermal conductivity than a thermal conductivity of the package body; and
a heat spreader thermally connected to the thermal via.

\* \* \* \* \*

UNITED STATES PATENT AND TRADEMARK OFFICE
CERTIFICATE OF CORRECTION

| | | |
|---|---|---|
| PATENT NO. | : 7,960,827 B1 | Page 1 of 1 |
| APPLICATION NO. | : 12/421118 | |
| DATED | : June 14, 2011 | |
| INVENTOR(S) | : Miller, Jr. et al. | |

It is certified that error appears in the above-identified patent and that said Letters Patent is hereby corrected as shown below:

In Column 16, Line 9, Claim 12, after "second", insert --electronic component;--

Signed and Sealed this
Thirteenth Day of September, 2011

David J. Kappos
*Director of the United States Patent and Trademark Office*